US006872281B1

United States Patent
Chen et al.

(10) Patent No.: US 6,872,281 B1
(45) Date of Patent: Mar. 29, 2005

(54) CHAMBER CONFIGURATION FOR CONFINING A PLASMA

(75) Inventors: Jian J. Chen, Fremont, CA (US); Mukund Srinivasan, Fremont, CA (US); Eric H. Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 77 days.

(21) Appl. No.: 09/676,269

(22) Filed: Sep. 28, 2000

(51) Int. Cl.[7] .............................. C23C 16/00; C23F 1/00
(52) U.S. Cl. ............................ 156/345.43; 156/345.47; 118/723 R; 118/723 E
(58) Field of Search .................. 118/723 R, 723 E, 118/723 I, 723 AN, 723 MW, 723 MR, 723 MA; 156/345.41, 345.43, 345.47, 347.48

(56) References Cited

U.S. PATENT DOCUMENTS

| | | | |
|---|---|---|---|
| 4,464,223 A | | 8/1984 | Gorin |
| 4,632,719 A | | 12/1986 | Chow et al. |
| 5,006,192 A | * | 4/1991 | Deguchi ..................... 118/715 |
| 5,271,788 A | * | 12/1993 | Hasegawa et al. ..... 156/345.46 |
| 5,456,757 A | * | 10/1995 | Aruga et al. ............. 118/723 E |
| 5,534,751 A | | 7/1996 | Lenz et al. |
| 5,605,637 A | | 2/1997 | Shan et al. |
| 5,900,103 A | | 5/1999 | Tomoyasu et al. |
| 5,998,932 A | | 12/1999 | Lenz |
| 6,019,060 A | | 2/2000 | Lenz |
| 6,051,100 A | | 4/2000 | Walko, II |
| 6,074,518 A | | 6/2000 | Imafuku et al. |
| 6,279,504 B1 | * | 8/2001 | Takaki et al. ............. 118/723 E |
| 6,444,087 B2 | * | 9/2002 | Nawata et al. .......... 156/345.41 |

FOREIGN PATENT DOCUMENTS

| | | | |
|---|---|---|---|
| EP | 0678903 | | 10/1995 |
| EP | 0814495 | | 12/1997 |
| EP | 0821395 | | 1/1998 |
| GB | 2251977 | | 7/1992 |
| WO | WO-0000992 | * | 1/2000 |

* cited by examiner

Primary Examiner—Luz Alejandro-Mulero
(74) Attorney, Agent, or Firm—Beyer Weaver & Thomas, LLP

(57) ABSTRACT

A plasma confining assembly for minimizing unwanted plasma formations in regions outside of a process region in a process chamber is disclosed. The plasma confining assembly includes a first confining element and second confining element positioned proximate the periphery of the process region. The second confining element is spaced apart from the first confining element. The first confining element includes an exposed conductive surface that is electrically grounded and the second confining element includes an exposed insulating surface, which is configured for covering a conductive portion that is electrically grounded. The first confining element and the second confining element substantially reduce the effects of plasma forming components that pass therebetween. Additionally, the plasma confining assembly may include a third confining element, which is formed from an insulating material and disposed between the first confining element and the second confining element, and proximate the periphery of the process region. The third confining element further reduces the effects of plasma forming components that pass between the first confining element and the second confining element.

27 Claims, 4 Drawing Sheets

CHAMBER CONFIGURATION FOR CONFINING A PLASMA

BACKGROUND OF THE INVENTION

The present invention relates to apparatus and methods for processing substrates such as semiconductor substrates for use in IC fabrication or glass panels for use in flat panel display applications. More particularly, the present invention relates to improved techniques for controlling plasma formation in a process chamber of a plasma reactor.

The use of plasma-enhanced processes in the manufacture of semiconductor-based products (such as integrated circuits or flat panel displays) is well known. In general, plasma-enhanced processes involve processing a substrate in a process chamber of a plasma reactor. In most plasma reactors, a plasma may be ignited and sustained by supplying a gas containing appropriate etchant or deposition source gases into the process chamber and applying energy to those source gases to respectively etch or deposit a layer of material on the surface of the substrate. By way of example, capacitive plasma reactors have been widely used to process semiconductor substrates and display panels. In capacitive plasma reactors, a capacitive discharge is formed between a pair of parallel electrodes when RF power is applied to one or both of the electrodes.

Although the plasma predominantly stays in the process area between the pair of electrodes, portions of the plasma may fill the entire chamber. A plasma typically goes where it can be sustained, which is almost anywhere in the chamber. By way of example, the plasma may fill the areas outside the process region such as the bellows of the pumping arrangement. If the plasma reaches these areas, etch, deposition and/or corrosion of the areas may ensue, which may lead to particle contamination inside the process chamber, and/or which may reduce the lifetime of the chamber or chamber parts. Furthermore, a non-confined plasma may form a non uniform plasma, which may lead to variations in process performance.

Accordingly, there are continuing efforts to produce plasmas, which are confined to the process region, and thus more stable. Confined plasmas tend to ensure efficient coupling of energy to discharges, enhance plasma uniformity, and increase plasma density, all of which lead to better processing uniformity and high yields on processed substrates. There are various ways to achieve a confined plasma. One approach uses external magnetic fields to confine the plasma. Another approach uses a confinement ring to confine the plasma. The confinement ring is typically formed from an insulating material that physically blocks the plasma pumping passage, thereby confining the plasma. Both approaches have proven to be highly suitable for plasma processing, and more particularly for improving process control and ensuring repeatability. Although these approaches work well, there are continuing efforts to improve plasma confinement, and more particularly for minimizing and/or eliminating the unwanted plasma formation in the region outside of the process region of the process chamber. For example, depending on power, pressure and chemistries, a relatively strong electric field and a substantial amount of residue ionic species may be present outside the confined plasma region, which can further induce glowing discharge outside the confined process region, i.e., plasma un-confinement.

SUMMARY OF THE INVENTION

The invention relates, in one embodiment, to a plasma confining assembly for minimizing unwanted plasma formations in regions outside of a process region in a process chamber. The assembly includes a first confining element positioned proximate the periphery of the process region. The first confining element includes an exposed conductive surface that is electrically grounded. The assembly further includes a second confining element positioned proximate the periphery of the process region and spaced apart from the first confining element. The second confining element includes an exposed insulating surface, which is configured for covering a conductive portion that is electrically grounded. The first confining element and the second confining element are arranged to substantially reduce the effects of plasma forming components (e.g., charged particles and/or electric fields) that pass therebetween.

In other embodiments, the plasma confining assembly additionally includes a third confining element formed from an insulating material. The third confining element is disposed between the first confining element and the second confining element and proximate the periphery of the process region. The third confinement element is arranged to physically contain a plasma inside the process region and to substantially reduce the effects of plasma forming components that pass between the first confining element and the second confining element.

The invention relates, in another embodiment, to a plasma reactor for processing a substrate. The plasma reactor includes a chamber having chamber walls. The plasma reactor further includes an electrode arrangement configured for generating an electric field, which is sufficiently strong to both ignite and sustain a plasma for the processing within the chamber. The electrode arrangement includes a first electrode and a second electrode, which are spaced apart thereby defining a process region therebetween. The plasma reactor additionally includes a plasma confinement assembly for preventing the plasma from forming outside of the process region. The plasma confinement assembly includes a first ring, which is configured to surround the first electrode, and a second ring, which is configured to surround the second electrode. The first ring includes an exposed conductive surface that is electrically grounded, and the second ring includes an exposed insulating surface covering a non exposed conductive element that is grounded. The plasma confinement assembly is arranged to substantially reduce the effects of plasma forming components that pass between the first confinement ring and the second confinement ring.

In some embodiments, the plasma confining assembly also includes a pressure control ring formed from a dielectric medium and disposed between the first and second rings. The pressure control ring is configured for physically confining a plasma within the process region, while permitting the passage of process gases to pass therethrough.

In other embodiments, the first ring includes an inner ring and an outer ring. The inner ring is formed from a dielectric medium and disposed between the first electrode and the outer ring, and the outer ring includes a grounded conductive surface. In other embodiments, the second ring includes an inner ring and an outer ring. The inner ring is formed from a dielectric medium and disposed between the second electrode and the outer ring, and the outer ring includes a conductive core, which is covered by the insulating layer, and which is electrically grounded.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
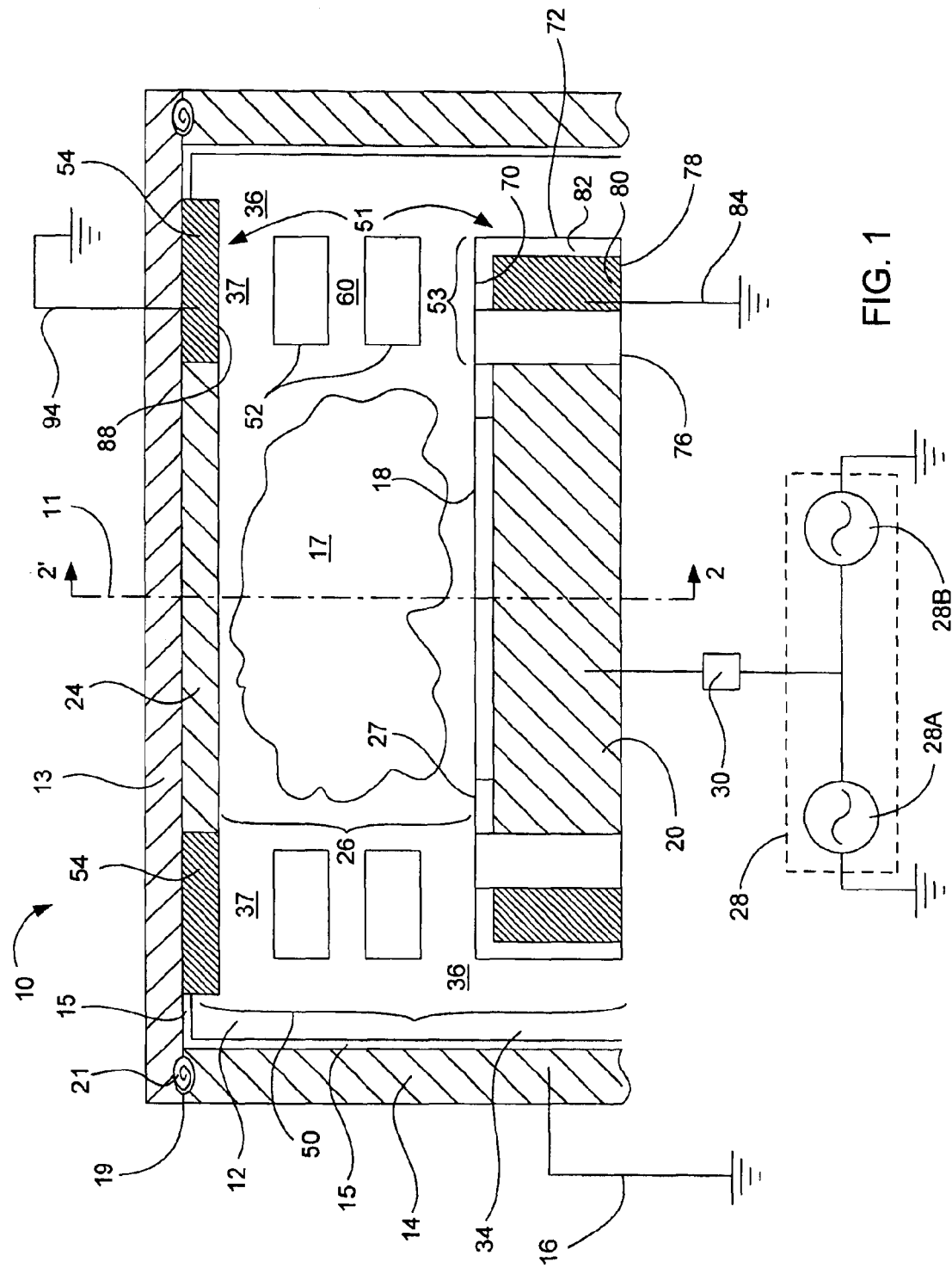
FIG. 1 illustrates a plasma reactor, in accordance with one embodiment of the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

It has been discovered that unwanted discharges or plasmas may be encountered when large charged particle fluxes and/or large electric fields are present in regions outside of the process region of the process chamber. As the term is employed herein, the process region refers to the region of the process chamber used for processing a substrate, for example, the area directly above the substrate. With regards to charged particles, charged particles leaving the process region may collide with the wall of the process chamber, and as a result generate secondary electrons that can ignite and/or sustain a plasma. With regards to the electric field, an electric field can accelerate the electrons causing them to collide with the gas molecules of the process gas, which as a result can ionize and initiate a plasma. In addition, charged particles tend to follow the electric field lines and thus stray electric field lines may guide more charged particles into regions outside of the process region of the process chamber. For example, electric fields can accelerate charged particles in a direction towards the walls of the process chamber. This acceleration and subsequent collision between the charged particles and the chamber walls may generate secondary electrons, which may ignite and/or sustain a plasma.

The invention therefore pertains to an improved method and apparatus for confining a plasma to a process region of a process chamber. More particularly, the invention pertains to a system for minimizing and/or eliminating unwanted discharges (or plasma formations) in regions outside of the process region of the process chamber. For ease of discussion, the regions outside of the process region will herein be referred to as the outer regions of the process chamber. One aspect of the invention relates to reducing the density of charged particles in the outer regions of the process chamber. For example, by absorbing particles on surfaces before they reach the outer regions or by not allowing the particles to pass to the outer regions. Another aspect of the invention relates to attenuating the electric field (used to form the plasma) in the outer regions of the process chamber. For example, by directing electric fields away from the outer regions. The invention is particularly useful in plasma processing systems that utilize capacitive discharges to form the plasma.

In accordance with one embodiment of the present invention, there is provided a plasma confining assembly for confining a plasma in a process region of a process chamber. The assembly includes a first confining element, which is positioned towards a side of the process region, and which includes an exposed conductive surface that is electrically grounded. The assembly also includes a second confining element, which is positioned towards the side of the process region and spaced apart from the first confining element, and which includes an exposed insulating surface covering an un-exposed conductive portion that is electrically grounded. In some configurations, the plasma confining assembly may include an insulated pressure control ring, which is also positioned towards the side of the process region, and between the first and second confining elements.

Although the above assembly is not limited to the following, it is generally believed that the above assembly achieves plasma confinement by capturing charged particles streaming out of the process region of the process chamber and shielding portions of the electric field straying outside of the process region of the process chamber. For instance, the assembly is configured to direct charge particles to the conductive surface of the first confining element and sink particles therethrough to ground so as to reduce the density of charged particles in regions outside of the process region. The assembly is also configured to neutralize some of the charged particles on the pressure control ring so as to reduce the density of charged particles in regions outside of the process region. Moreover, the assembly is configured to redirect stray electric fields through the conductive surface and to ground so as to reduce electric fields in regions outside of the process region. For example, the direction of electric fields can be altered so that the electric fields no longer have a line of sight that extends to the outer regions of the process chamber or the chamber walls.

Embodiments of the invention are discussed below with reference to FIGS. 1–7. However, those skilled in the art will readily appreciate that the detailed description given herein with respect to these figures is for explanatory purposes as the invention extends beyond these limited embodiments.

FIG. 1 is a schematic diagram of a plasma reactor 10, in accordance with one embodiment of the present invention. Plasma reactor 10 includes a process chamber 12, a portion of which is defined by a top plate 13 and chamber walls 14, and within which a plasma 17 is both ignited and sustained for processing a substrate 18. Substrate 18 represents the work piece to be processed, which may represent, for example, a semiconductor substrate to be etched or otherwise processed or a glass panel to be processed into a flat panel display. In most embodiments, the process chamber 12 is arranged to be substantially cylindrical in shape, and the chamber walls are arranged to be substantially vertical. Furthermore, the top plate 13 and chamber walls 14 are generally grounded and formed from a suitable material such as aluminum. In the embodiment shown, the top plate 13 and chamber walls 14 are electrically connected (at interface 19) and grounded as indicated at 16. The top plate 13 and chamber walls 14 may also include insulating surfaces 15, which may be formed from a suitable dielectric material or in the case of an aluminum top plate or chamber wall the insulating surface may formed from anodized aluminum. It should be understood, however, that the above mentioned configurations are not a limitation and that they may vary according to the specific design of each plasma reactor. For example, the chamber walls may be sloped or the top plate may be separately grounded.

In most embodiments, the substrate 18 is introduced into the process chamber 12 and disposed between a pair of parallel electrodes, and more particularly a bottom electrode 20 and a top electrode 24. The bottom and top electrodes 20, 24 define a process region 26 therebetween. As shown, the plasma 17 is confined vertically between the bottom electrode 20 and the top electrode 24. The bottom electrode 20 may serve as a chuck for supporting and holding the substrate 18 during processing. By way of example, the chuck may be an electrostatic chuck, a vacuum chuck, or a mechanical chuck. The electrodes 20, 24 are also generally arranged to be substantially cylindrical in shape and axially aligned with an axis 11 of the process chamber 12 such that the process chamber 12 and the electrodes 20, 24 are cylindrically symmetric. In addition, the electrodes 20, 24 are generally configured with similar dimensions, for example, the electrodes may have the same diameter. It should be appreciated, however, that the size, shape and placement of the electrodes may vary according to the specific design of each plasma reactor. Furthermore, an edge ring 27 may be provided to improve the electrical and mechanical properties of processing near the substrate's edge, as well as to shield the bottom electrode 20 from reactants (i.e., ion bombardment). The edge ring 27 is arranged to surround the edge of the substrate 18 and cover the bottom electrode 20. The edge ring 27 is generally formed from a suitable dielectric material such as ceramic, quartz, plastic and the like.

In general, the electrodes 20, 24 are configured to deliver high frequency energy into the process region 26 of the process chamber 12 so as to ignite and sustain the plasma 17. More specifically, and in the embodiment shown, the top electrode 24 is coupled to the top plate 13, which is grounded as indicated at 16, and the bottom electrode 20 is coupled to an RF power supply 28 via a matching network 30. Matching networks are generally well known in the art and for the sake of brevity will not be discussed in great detail herein. The top electrode 24 is arranged to be electrically continuous with the top plate 13, and therefore the top electrode 24 is also grounded (e.g., completes RF circuit). The top electrode 20 may be formed form a suitable conductive material such as silicon. Furthermore, the RF power supply 28 is configured to supply the bottom electrode 20 with RF energy. In the illustrated embodiment, the RF power supply 28 consists of a first RF power supply 28A and a second RF power supply 28B. The first RF power supply is configured to apply a first RF frequency to the bottom electrode 20 and the second RF power supply is configured to apply a second RF frequency to the bottom electrode 20. By way of example, the first RF frequency may be about 27 MHz and the second RF frequency may be about 2 MHz. As is generally well known, a higher frequency is used to control the density of the plasma and the quantity of ions incident on the substrate, while a lower frequency is used to control the energy of the ions incident on the substrate. Moreover, the bottom electrode 24 may be formed from a suitable conductive material such as aluminum.

In the plasma reactor shown in FIG. 1, the RF frequencies are driven on the bottom electrode 20 and capacitively coupled to the plasma 17. The plasma 17 and its sheaths oscillate periodically at these radio frequencies and the positive ions in the plasma 17 are accelerated by the sheath voltage to the grounded top electrode 24. As should be appreciated, the driving RF currents supplied to the bottom electrode 20 should be balanced with the plasma ion current on the top electrode 24 plus any ion flux leaking out of the process region 26. In the sense of an electric circuit, this is continuity for the RF current. In an ideal situation, the RF current comes in the bottom electrode 20 passes through the plasma 17 to the top electrode 24, and then travels through the top plate 13 to the chamber 14, where it finally terminates to the ground 16 and completes a round trip.

In accordance with another aspect of the invention, therefore, good electrical conductance through the desired RF return path is provided to enhance plasma confinement. A good electrical path helps to drive the RF frequencies and therefore to efficiently couple RF to the plasma. More specifically, a good electrical path tends to attract more ion flux to the top electrode which as a result reduces the ion flux to the other undesirable paths such as outside of the confined region or process region 26. Accordingly, the plasma is better confined.

In one embodiment, the top electrode 24 is formed from a low resistivity material so as to improve the electrical conductance through the RF return path. By way of example, the top electrode may be formed from a suitable semiconductor (e.g., silicon) having a resistivity (bulk) in the range of about 10 ohm-cm to about 0.01 ohm-cm.

In another embodiment, good electrical contact is made between the top plate 13 and the chamber walls 14 (interface 19) so as to improve the electrical conductance through the RF return path. In this embodiment, the good electrical contact is made by introducing a RF gasket 21 at the interface 19, i.e., between the top plate 13 and the chamber wall 14. The RF gasket 21 is configured to be a compliant electrical conductor. By compliant it is meant that the RF gasket 21 takes the shape of the top plate 13 and the chamber wall 14 at the interface 19. In one configuration, the cross sectional shape of the RF gasket 21 takes the form of a spiral (similar to a thin circular spring). The spiral allows the RF gasket 21 to become compressed between the top plate 13 and the chamber wall 14 so as to couple the two together. When compressed, each spiral contacts an adjacent surface making the RF gasket 21 an integrated conductive element that provides an electrical path between the top plate 13 and the chamber walls 14. The RF gasket is generally formed from a suitable conductive material such as stainless steel.

Although the bottom electrode is shown and described as being coupled to a pair of RF power supplies, it should be understood that other configurations may be used to accommodate different process chambers or to conform to other external factors necessary to allow the coupling of energy. For example, a single frequency plasma reactor or a dual frequency plasma reactor with one RF power supply coupled to the bottom electrode and another coupled to the top electrode may be used.

In addition, a gas injector (not shown) is typically provided for releasing a single gaseous source material or a mixture of gaseous source materials into the process chamber 12, and more particularly the process region 26 between the top and bottom electrodes 20, 24. By way of example, a gas injection port(s) may be built into the walls of the process chamber itself or through a shower head arrangement in the top electrode. An exhaust port 34 is also provided for exhausting spent gases formed during processing. As shown, the exhaust port 34 is located in an outer region 36 of the process chamber 12 and disposed between the chamber walls 14 and the bottom electrode 20. The exhaust port 34 is generally coupled to a turbomolecular pump (not shown), which is located outside of the process chamber 12, and which is arranged to maintain the appropriate pressure inside the process chamber 12. Furthermore, although the exhaust port is shown disposed between the chamber walls and the bottom electrode, the actual placement of the exhaust port may vary according to the specific design of each plasma processing system. For example, the exhausting of gases may also be accomplished from ports built into the chamber walls. Gas systems that include gas injectors and exhaust ports are well known in the art and for the sake of brevity will not be discussed in anymore detail herein.

In order to create the plasma 17, a process gas is typically input into the process region 26 from the gas injection port or ports (not shown). Power is then supplied to the bottom electrode 20 using the RF power source 28, and a large electric field (shown graphically with electric field lines 95) is produced inside the process chamber 12. Most of the electric field lines are contained between the bottom electrode 20 and top electrode 22, although some electric field lines may stray beyond this boundary. The electric field accelerates the small number of electrons present inside the process chamber 12 causing them to collide with the gas molecules of the process gas. These collisions result in ionization and initiation of the plasma 17. As is well known in the art, the neutral gas molecules of the process gas when subjected to these strong electric fields lose electrons, and leave behind positively charged ions.

As a result, positively charged ions, negatively charged electrons and neutral gas molecules are contained inside process chamber 12. During processing, the ions are typically made to accelerate towards the substrate where they, in combination with neutral species, activate substrate processing, i.e., etching, deposition and/or the like.

Most of the charged species (e.g., ions and electrons) are contained inside the process region 26 to facilitate substrate processing, although some charged species may stray outside of this region (for example through the pumping passage 37).

In accordance with one embodiment of the invention, during operation of the plasma reactor 10, the plasma discharge generated between the electrodes 20 and 24 is substantially confined to the process region 26 by providing a confinement system 50.

Figure 2:
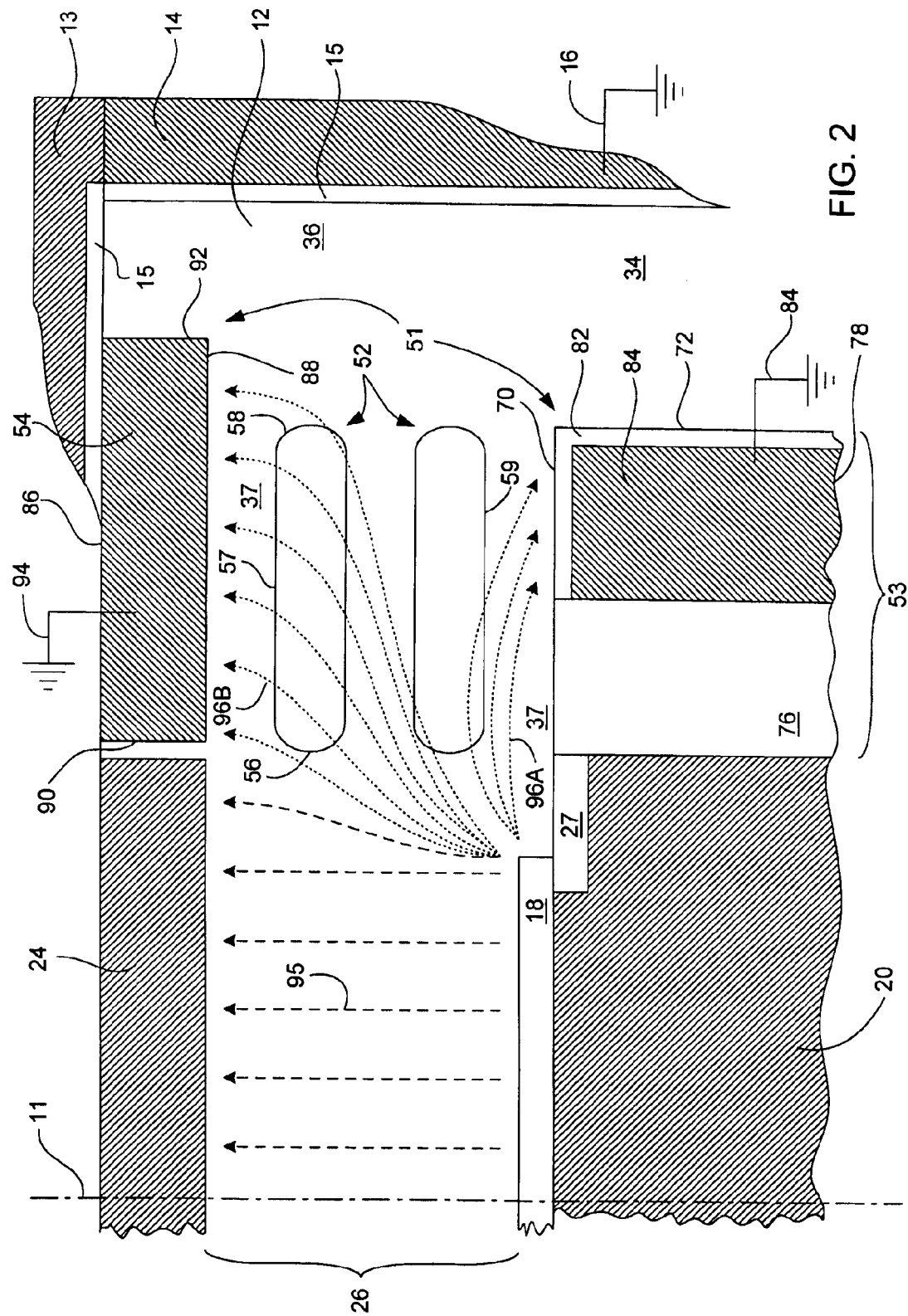
FIG. 2 shows a broken away view of the plasma reactor of FIG. 1, in accordance with one embodiment of the present invention.

For ease of discussion, FIG. 2 depicts a broken away side view of the plasma reactor 10 in accordance with this embodiment so as to provide a closer look at the confinement system 50 and its functions. The confinement system 50 includes a pressure control ring 52 (or confinement ring) and a confining assembly 51, including an upper ring 53 and a lower ring 54. In the embodiment shown, the confining system 50 is disposed in a pumping passage 37, which is positioned to the side of the process region 26. The confinement system 50 is configured for confining the plasma 17 to the process region 26 of the process chamber 12 and for minimizing and/or eliminating unwanted plasma formations in the outer regions 36 of the process chamber 12. In most cases, the pressure control ring 52 is configured for physically confining the plasma 17 and for neutralizing a portion of the charged particles that stray out of the process region 26. In addition, the confining assembly 51 is configured for capturing (neutralizing) a portion of the charged particles that stray out of the process region 26 and for attenuating the electric field lines that stray out of the process region 26. Moreover, the confining assembly 51 may be configured to at least in part physically confine the plasma 17.

The pressure control ring 52 is an annular ring arranged to surround the process region 26 and to control the gas pressure in the plasma 17. The pressure control ring 52 is generally disposed between the planes that define the surfaces of the electrodes 20 and 24, and more particularly is disposed within the pumping passage 37 adjacent to the process region 26. As shown, the pressure control ring 52 physically blocks a portion of the pumping passage 37 and thus it can restrict the plasma 17 from radially leaving the process region 26 (e.g., confinement). More specifically, the pressure control ring 52 has an inner surface 56, which is exposed to the process region 26 and an outer surface 58, which is exposed to the outer region 36. The pressure control ring 52 also has an upper surface 57, which is spaced apart from the upper ring 54, and a lower surface 59, which is spaced apart from the lower ring 53. As such, the pressure control ring 52 is disposed between the upper and lower rings 53, 54. In addition, the pressure control ring 52 is generally formed from an insulating material and can be either a single ring or several rings.

Furthermore, the pressure control ring 52 generally includes a plurality of passages 60 extending from the inner surface 56 to the outer surface 58. The passages 60 are dimensioned to permit by-product gases or spent gases (formed during processing) to pass through while substantially confining the plasma to the process region 26. In addition, the passages 60 are configured to substantially neutralize charged particles (created in the plasma) that stream out of the process region 26. More specifically, the passages are appropriately proportioned such that the distance a charged particle must travel in the passages is substantially longer than the mean free path of the charged particle so that most exiting particles make at least one collision with the walls of the passage. These collisions tend to neutralize the charge of the particle. Accordingly, the tendency for a discharge outside the process region is reduced.

As should be appreciated, the width (from 57 to 59) and thickness (from 56 to 58) of the pressure control ring 52 can be adjusted to enhance plasma confinement. For example, a pressure control ring with a relatively large width and thickness generally lead to better plasma confinement since a large width or a large thickness restricts gas pumping conductance and increases the residence time for charged species and radicals to pass through, thereby increasing the chance of charge exchange and neutralization. In particular, a wider pressure control ring provides more surface area for charged species to be exchanged and neutralized and for radicals to be quenched, while a pressure control ring with relatively large thickness further reduces the direct line of site gap from the confined plasma region to the outside, thereby reducing the chance of the direct electrical breakdown.

In one configuration, the pressure control ring includes a stack of annular rings formed from a suitable dielectric material such as high quality fused silica or quartz. When assembled, the annular rings are separated by spacers (not shown) that also may be formed from a suitable dielectric material such as quartz. The spacers may be washers or raised regions of the annular rings. Screws may be threaded through the rings and washers to form a rigid structure. In addition, the pressure control ring can be supported directly or indirectly by connecting it to some portion of the process chamber, for example to the upper ring. The spaces between adjacent rings form distinct parallel circumferential passages or slots. The slots extend essentially around the full circumference of the pressure control ring, being interrupted only by the spacers. An example of a pressure control ring such as the one described above may be found in commonly assigned U.S. Pat. No. 5,534,751 to Lenz, et al, which is herein incorporated by reference. In addition, the pressure control ring may be arranged to move between a first and second position in order to effect the pressure at the surface of the substrate. This may further enhance the processing performance of the plasma reactor. An example of a moving pressure control ring such as this may be found in commonly assigned U.S. Pat. No. 6,019,060 to Lenz, which is also incorporated herein by reference.

With regards to the lower ring 53, the lower ring 53 is an annular ring arranged to concentrically surround the bottom electrode 20. In the embodiment shown, the lower ring 53 is disposed between the bottom electrode 20 and the chamber wall 14, and more particularly adjacent the side of the bottom electrode 20 so as to provide space for the exhaust port 34. It should be noted, however, that in some instances the lower ring may provide secondary confinement (e.g., physical) by extending into the exhaust port, and may include holes or passages for allowing the gases to pass therethrough. In general, the top surface 70 of the lower ring 53 defines a lower passage of the pumping passage 37. As shown, a top surface 70 of the lower ring 53 is at about the same level as the plane that defines the top surface of the bottom electrode 20. Furthermore, the top surface 70 and a side surface 72 of the lower ring 53 are exposed to the interior of the process chamber 12.

The lower ring 53 includes an inner side ring 76 and an outer side ring 78. The inner side ring 76, as its name suggests, is located in an inner portion of the lower ring 53, and thus it is adjacent to the bottom electrode 20. The outer side ring 78, on the other hand, is located in an outer portion of the lower ring 53. In general, the outer side ring 78 is configured with a conductive core 80, which is electrically grounded as indicated at 84 (providing an RF return path), and which is either fully or partially surrounded by an insulating surface 82. The insulating surface 82 is arranged to cover at least the portions of the outer side ring 78 that are exposed to the process chamber 12, for example the top surface 70 and the side surface 72. Although not shown, the insulating surface may also cover the unexposed portions of the outer side ring 78. Furthermore, the inner side ring 76 is formed from an electrically insulating material so as to isolate the outer side ring 78 from the RF-driven bottom electrode 20 and to prevent any electrical breakdown and arcing therebetween. By way of example, the inner ring 76 may be formed from dielectric, quartz, ceramic, plastic and may have air pockets arranged therein.

In one embodiment, the outer side ring is formed from aluminum, and the exposed surfaces, for example, top surface 70 and side surface 72 are anodized aluminum surfaces. As should be appreciated, the anodized surfaces are insulating surfaces, and thus the ambient RF is capacitively terminated to the inside aluminum (conductive core) through the anodized layer. The capacitance is typically low because of the thin anodized surface. This configuration of the outer side ring is helpful for plasma confinement, and will be discussed in greater detail below.

With regards to the upper ring 54, the upper ring 54 is an annular ring arranged to concentrically surround the upper electrode 24, and is generally attached to the top plate 13 of the process chamber 12. In the embodiment shown, the upper ring 54 is disposed between upper electrode 20 and the chamber wall 14, and more particularly proximate the side of the upper electrode 24. The upper ring 54 includes an upper surface 86, a bottom surface 88, an inside surface 90 and an outside surface 92. In some embodiments, the side surface 90 of the upper ring 54 may be adjacent to the top electrode 24, and in other embodiments (as shown), a space may be provided between the top electrode 24 and the inside surface 90 of the upper ring so as to provide clearance for thermal expansion. As shown, the outside surface 92 of the upper ring 54 is configured to extend farther away from the axis 11 of the process chamber 12 than the side surface 72 of the lower ring 53. In general, the bottom surface 88 defines an upper passage of the pumping passage 37. Furthermore, the bottom surface 88 is at about the same level as the plane that defines the top surface of the upper electrode 24. It should be noted, however, that this is not a limitation and that the width of the upper ring (from surface 86 to surface 88) may be altered to restrict gas pumping in a manner similar to the pressure control ring so as to enhance plasma confinement. By way of example, the bottom surface 88 may extend in a direction towards the lower ring 53. As shown, the bottom surface 88 and the outside surface 92 of the upper ring 54 are exposed to the interior of the process chamber 12. Furthermore, the bottom surface 88 of the upper ring 54 is in a position that faces the top surface 70 of the lower ring 53. In most embodiments, the bottom surface and the top surface are substantially parallel to one another and perpendicular to the axis 11.

The upper ring 54 is formed from a suitable conductive material and is electrically grounded. The upper ring 54 can be indirectly grounded through the top plate 13 or directly grounded as indicated by 94 in FIG. 1 (providing both a DC path and a RF return path). Furthermore, the upper ring 54 is arranged to be substantially resistant to etching by the plasma 17 or to contribute substantially no metal contamination. By way of example, the upper ring 54 can be formed from a bare metal, SiC, Si sputtered over metal or the like.

The confining assembly 51, including the lower ring 53 and the upper ring 54, has several functions that can have large effects on plasma confinement. One function includes substantially neutralizing charged particles that stream out of the process region. This is accomplished at least in part by sinking charged species at the upper ring 54. More specifically, the grounded bottom surface 88 acts as a charge sink or drain for positive ions to get neutralized before escaping the confined process region. While not wishing to be bound by theory, it is generally believed that the RF voltage creates a DC potential between the conductive and insulated surfaces during processing. The DC potential guides charged species to either the top insulated surface 70 of the lower ring 53 or to the bottom conductive surface 88 of the upper ring 54. As a result, the exiting particles make at least one collision with the top surface 70 or the bottom surface 88. Upon collision, a current flow is created that essentially removes the charge (via ground) from the charged particle, which as a result tends to neutralize the charge of the particle. For example, the conductive bottom surface 88 provides a DC ground path for charged species. As such, the density of charged particles in the outer region are substantially reduced. Accordingly, the tendency for a discharge outside the process region is reduced.

In one embodiment, the surface area of the grounded and conductive bottom surface 88 is used to control the amount of sinking particles. In effect, the greater the surface area of the bottom surface, the greater the effect in sinking charged particles.

Another function includes shielding the ambient RF (or stray electric field lines) to reduce the strength of the electric field outside the confined process region 26. This is accomplished by attracting the electromagnetic fields of the driving RF that would otherwise diverge radially outward to outside the confined process region 26 to the conductive elements of the upper and lower rings, i.e., the conductive core and conductive bottom surface. As shown in FIG. 2, a portion of the diverging or stray electric fields (shown graphically with electric field lines 96) are removed from the outer region 36 via the outer side ring 78 of the lower ring 53, as well via the upper ring 54. For ease of discussion, the electric field lines 96, which are removed by the outer side ring 78 are designated 96A, and the electric field lines, which are removed by the upper ring 54 are designated 96B. The electrical field lines 96B, which are incident on the upper ring, tend to be perpendicular because of the exposed conductive surface, while the electrical field lines 96A, which are incident on the outer side ring, tend to be angled because of the insulated top surface. The stray electric field lines 96A couple through the insulated top surface 70 to the conductive core 80, and travel through the conductive core 80 to ground 84. In addition, the stray electric field lines 96B travel to the conductive bottom surface 88 and through the conductive bottom surface 88 to ground 94. As should be appreciated, both the conductive bottom surface and the insulated conductive core provide an RF return path. As such, the stray electric fields in the outer region are substantially reduced by both the upper ring and the outer side ring of the lower ring. Accordingly, the tendency for a discharge outside the process region is reduced.

Furthermore, charged particles tend to follow electric field lines 96A & B and therefore by reducing the electric fields in the outer region the density of charged particles in this region is also reduced. Moreover, the charged particles tend to be directed to the conductive bottom surface of the upper ring 54 by electric field 96B, which as a result, neutralizes the charged particles, especially the ionic species. The charged particles also tend to be directed to the surfaces of the pressure control ring 52, which as a result, neutralizes some of the charged particles. Accordingly, the tendency for a discharge outside the process region is reduced.

In one embodiment, the surface area of the bottom surface 88, as well as the surface area of the top surface 70 is used to control the amount of shielded field lines. In effect, the greater the surface area, the greater the effect in shielding electric fields.

Figure 3:
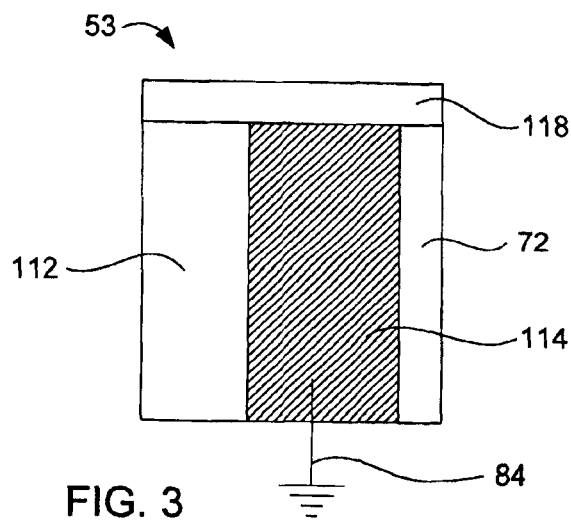
FIG. 3 illustrates a lower ring, in accordance with one embodiment of the present invention.

In alternate embodiment, and as shown in FIG. 3, the lower ring 53 may include a first ring 112, a second ring 114, a third ring 116 and a top ring 118. In this figure, the rings are produced in accordance with the teachings of the invention set forth above with regard to inner side ring 76 and the outer side ring 78. That is, the first ring 112 corresponds to the inner side ring 76, the second ring 114 corresponds to the conductive core 80, the third ring 116 corresponds to the side surface 72, and the top ring 118 corresponds to the top surface 70. As such, the first ring 112, the third ring 116 and the top ring 118 are formed from a suitable insulating material, while the second ring 114 is formed from a suitable conductive material. The second ring 114 is also electrically grounded as indicated by 84. In another embodiment, the first ring 112, the third ring 116 and the top ring 118 may represent an integrally formed structure such that the second ring is embedded therein. In another embodiment, the first ring 112, the third ring 116 and the top ring 118 may represent a composite structure, where each of the rings is formed from a different dielectric material. In yet another embodiment, the top ring may be an extension of the edge ring 27.

In one configuration, the lower ring includes an annular dielectric body having a first portion and a second portion, which encircle the bottom electrode, and a conductive core, which comprises a tube-shaped portion and an inwardly-protruding portion. The tube shape portion substantially surrounds and shields the lower portion of the annular dielectric body, while the inwardly-protruding portion is embedded within the annular dielectric body itself. An example of a lower ring such as the one described above may be found in commonly assigned U.S. Pat. No. 5,998,932 to Lenz, which is herein incorporated by reference.

Figure 4:
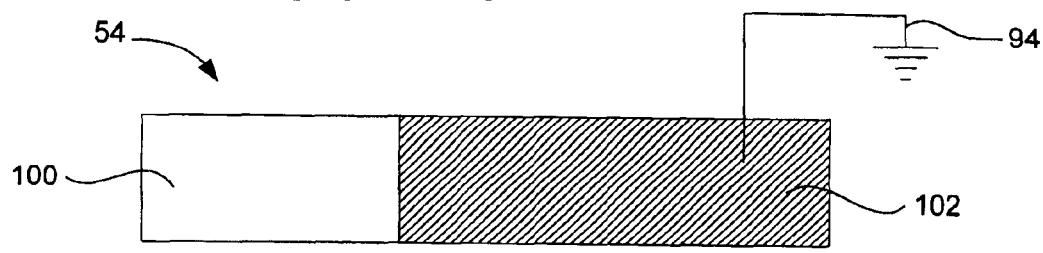
FIG. 4 illustrates an upper ring, in accordance with one embodiment of the present invention.

In another alternate embodiment, and as shown in FIG. 4 the upper ring 54 can be split into two rings, an inner upper ring 100 and an outer upper ring 102. The inner upper ring 100, as its name suggests, is located in an inner portion of the upper ring 54, and thus it is proximate to the upper electrode (not shown in this figure). The outer upper ring 102, on the other hand, is located in an outer portion of the upper ring 54. The inner upper ring 100 is formed from a suitable dielectric material, while the outer upper ring 102 is formed from a suitable conductive material and electrically grounded as indicated at 94. The inner upper ring 100 is configured to reduce particle generation due to plasma sputtering on the inner edge of the upper ring 54 that is directly exposed to the confined plasma (plasma 17 as shown in FIGS. 1 & 2). The outer upper ring 102, however, is produced in accordance with the teachings of the invention set forth above with regards to the single piece upper electrode. That is, the residue ions still get neutralized on the conductive surface of the grounded outer upper ring 102 before escaping to outside the confined process region, and the electric field still gets shielded by the grounded conductive outer upper ring 102.

Figure 5:
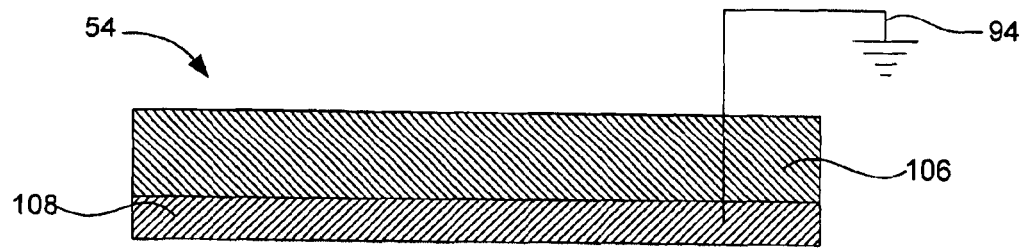
FIG. 5 illustrates an upper ring, in accordance with one embodiment of the present invention.

In another alternate embodiment, and as shown in FIG. 5 the upper ring 54 can include a top layer 106 and a bottom layer 108. The top layer 106 is disposed in an upper portion of the upper ring 54, and thus it is proximate to the top plate (not shown in this figure). The bottom layer 108 is disposed in a bottom portion of the upper ring 54, and thus it is exposed to the interior of the process chamber 12. The top layer may be formed from any suitable material whether conductive or insulating. On the other hand, the bottom layer 108, which is electrically grounded as indicated by 94, is formed from a suitable conductive material. In this embodiment, the bottom layer 108 is produced in accordance with the teachings of the invention set forth above with regards to the single piece upper electrode. That is, the residue ions still get neutralized on the conductive surface of the grounded bottom layer 108 before escaping to outside the confined process region, and the electric field still gets shielded by the grounded bottom layer 108. In one implementation, the bottom layer 108 may be sputtered onto the top layer 106. Because there is not much current, the sputtered layer can be a very thin layer of conductive material.

Figure 6:
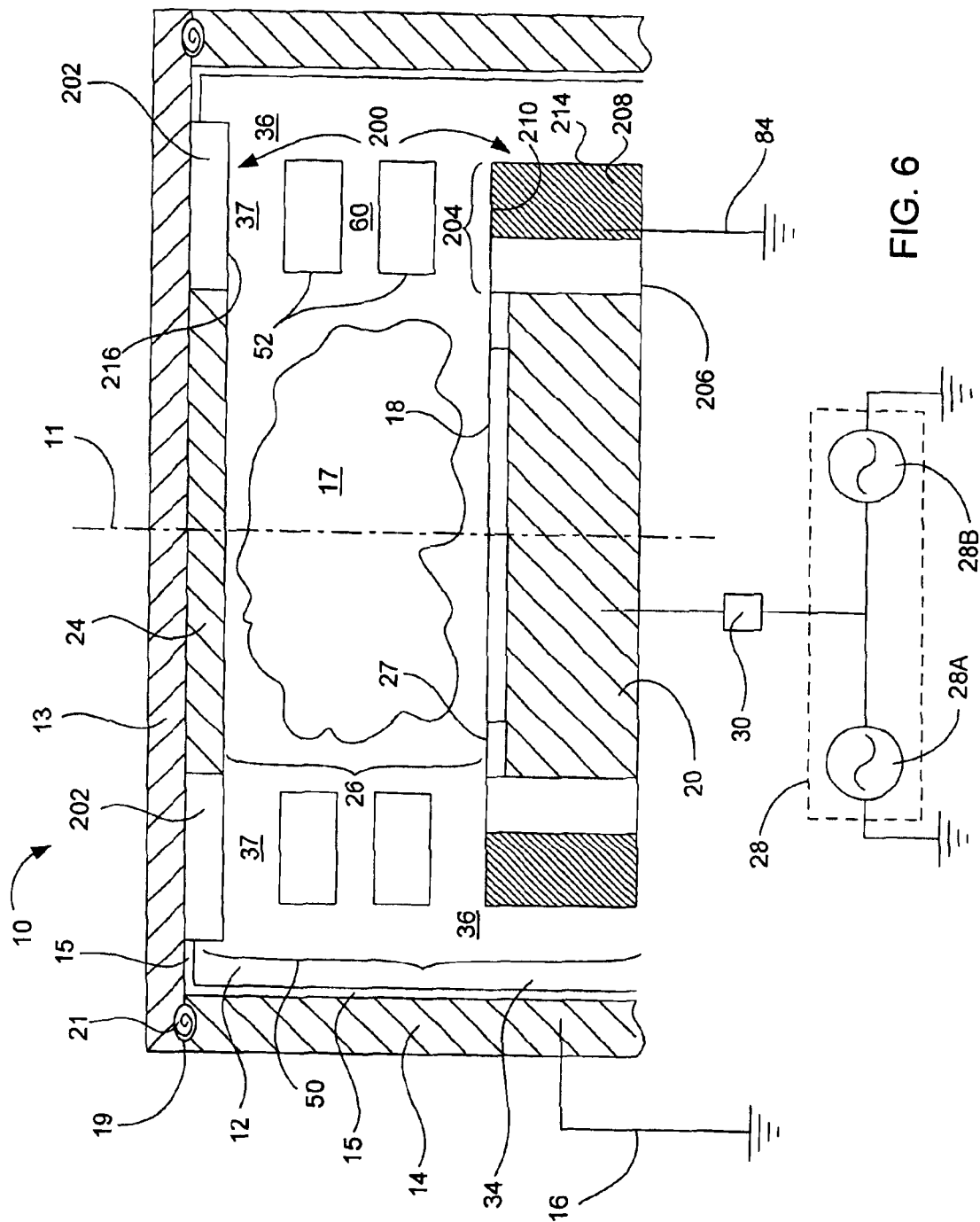
FIG. 6 illustrates a plasma reactor, in accordance with one embodiment of the present invention.

In accordance with another embodiment of the present invention, the configurations of the upper and lower ring can be reversed. That is, the upper ring can have an insulating bottom surface, and the lower ring can have a conductive top surface. The features of this embodiment may be better understood with reference to the figure that follows. FIG. 6 illustrates a relevant portion of the plasma reactor 10 of FIG. 1, including process chamber 12, top plate 13, chamber walls 14, bottom electrode 20, upper electrode 24, and pressure control ring 52. FIG. 6 also illustrates a confining assembly 200 including an upper ring 202 and a lower ring 204 having an inner side ring 206 and an outer side ring 208. The inner side ring 206 may respectively correspond to the inner side ring 76 illustrated in FIG. 1. The outer side ring 208, on the other hand, includes a top surface 210, which is exposed to the interior of the process chamber 12. In this embodiment, the outer side ring 208, and more particularly, the top surface 210 of the outer side ring is formed from a suitable conductive material and is grounded as indicated by 84. By way of example, the outer side ring 208 or the top surface may be formed from a bare metal, SiC, or Si sputtered over metal. Additionally, the outer side ring 208 may include a side surface 214, which is also exposed to the interior of the process chamber 12. In some configurations, the side surface 214 is formed from a suitable conductive material, while in other configurations, the side surface 214 is formed from a suitable insulating material. For ease of discussion, the size, shape and position of the outer side ring 208 may respectively correspond to the outer side ring 78 illustrated in FIG. 1. With regards to the upper ring 202, the upper ring 202 includes a bottom surface 216, which is also exposed to the interior of the process chamber 12. As shown, the bottom surface 216 faces the top surface 210. In this embodiment, the upper ring 202, and more particularly, the bottom surface 216 is formed from a suitable insulating material. By way of example, the upper ring 202 may be formed from dielectric, ceramic, plastic, and the like. Like the outer side ring, the size, shape and position of the upper ring 202 may respectively correspond to the upper side ring 54 illustrated in FIG. 1.

In a manner analogous to the confining assembly 51 of FIG. 1, the confining assembly 200 of FIG. 6 can greatly improve plasma confinement. For example, since to the grounded top surface 210 is directly exposed to the interior of the process chamber 12, a clearly defined sheath forms on the top of this surface, and a voltage is built up across the sheath that can further guide positive ions to the surface. As such, the grounded top surface acts as a charge sink or drain for positive ions to get neutralized before escaping the confined region. Accordingly, plasma confinement is substantially improved because positive ions that are leaking to the outside of the confined region are greatly reduced. In addition, the conductive top surface 210 effectively shields the ambient RF (or stray electric field lines) to reduce the strength of the electric field outside the confined process region 26. Again, this is accomplished by attracting the electromagnetic fields of the driving RF that would otherwise diverge radially outward to outside the confined process region 26 to the conductive elements of the lower ring, i.e., the conductive top surface.

Figure 7:
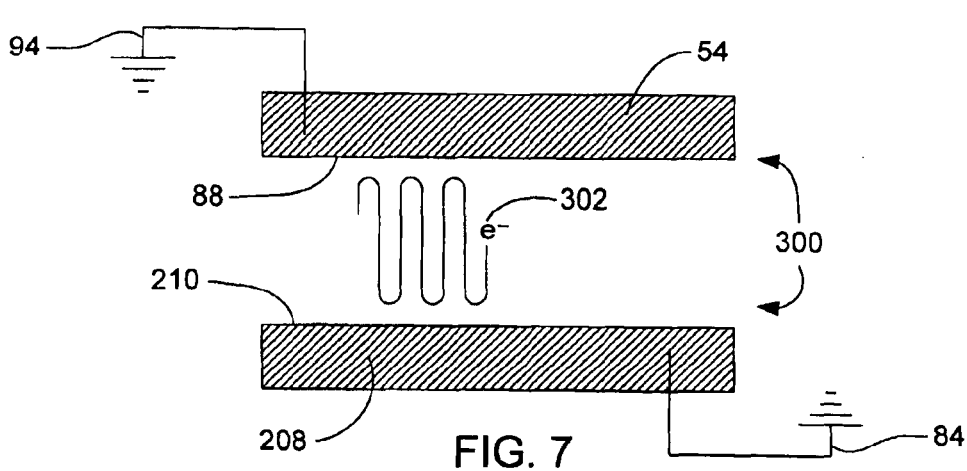
FIG. 7 shows a conductive upper ring and a conductive lower ring.

As discussed above, the combination of a conductive top surface (e.g., outer side ring) and an insulating bottom surface (e.g., upper ring) or the combination of a conductive bottom surface (e.g., upper ring) and an insulating top surface (e.g., outer side ring) can greatly improve plasma confinement. Unfortunately, however, the combination of a conductive top surface (e.g., outer side ring) and a conductive bottom surface (e.g., upper ring) can adversely effect plasma confinement. To facilitate discussion, FIG. 7 shows a confinement assembly 300 including a lower ring 208 having a conductive top surface 210 and an upper ring 54 having a conductive bottom surface 88. As shown, there is nearly line-of-sight path between the outer edge of the upper ring 54 and the outer edge of the lower ring 208. The electrons or negative ions 302 may become trapped in the potential well defined by the sheaths formed on the conductive bottom surface 88 of the upper ring 54 and the conductive top surface 210 of the lower ring 208. Similar to the hollow cathode effect, these trapped negative species 302 oscillate back and forth in the potential well. As a result, a glowing discharge can be induced through the collisions of other ions and neutrals (not shown) with the trapped negative species 302. Accordingly, either a combination of a dielectric upper ring and an outer side ring with a conductive surface or a combination of a conductive upper ring and an outer side ring with a dielectric top surface is implemented to improve plasma confinement.

The above concepts have been extensively tested and proved to be valid in experiments. A Langmuir probe and an E-field probe have been implemented in a dual frequency capacitive discharge reactor such as the capacitively coupled Exelan™ plasma reactor, which is available from Lam Research Corporation of Fremont, Calif., to measure, respectively, the ion flux and the electric field outside the confined process region. These measurements confirmed that the electric field and the ion flux in regions outside of the process region were substantially lower than in the prior art.

As can be seen from the foregoing, the present invention offers numerous advantages over the prior art. Different embodiments or implementations may have one or more of the following advantages. One advantage of the present invention includes confining a plasma to a process region of the process chamber, while permitting by-product gas from processing to pass through. Another advantage of the present invention includes minimizing and/or eliminating unwanted plasma formations in the regions outside of the process region of the process chamber. Accordingly, the plasma can be controlled to a specific volume and a specific location inside the process chamber, ensuring more efficient coupling of energy, enhancing plasma uniformity, and increasing plasma density, all of which lead to better processing uniformity and high yields on processed substrates.

While this invention has been described in terms of several preferred embodiments, there are alterations, permutations, and equivalents, which fall within the scope of this invention. It should also be noted that there are many alternative ways of implementing the methods and apparatuses of the present invention. For example, although the confining assembly has been described and shown in terms of a capacitively coupled plasma reactor for processing substrates, it should be noted that other plasma systems could apply the techniques and methods of the confining assembly. For example, it is contemplated that the confining assembly could be used in inductively coupled or microwave plasma reactors. It is therefore intended that the following appended claims be interpreted as including all such alterations, permutations, and equivalents as fall within the true spirit and scope of the present invention.

What is claimed is:

1. A plasma confining assembly for minimizing unwanted plasma formations in regions outside of a process region in a process chamber, comprising:

a first confining element positioned proximate the periphery of the process region, and including a conductive surface that is electrically grounded and exposed to said process region; and a second confining element positioned proximate the periphery of the process region, and including an exposed insulating surface, which is configured to at least partially cover a non-exposed conductive core that is electrically grounded, the second confining element being spaced apart from the first confining element such that one of the confining elements is disposed in an upper portion of the process chamber and the other confining element is disposed in a lower portion of the process chamber, wherein the first confining element and the second confining element substantially reduces the effects of plasma forming components that pass therebetween.

2. The plasma confining assembly as recited in claim 1 further including a third confining element formed from an insulating material and disposed between the first confining element and the second confining element, and proximate the periphery of the process region, the third confinement element being arranged to physically contain a plasma inside the process region and to substantially reduce the effects of plasma forming components that pass between the first confining element and the second confining element.

3. The plasma confining assembly as recited in claim 2 wherein the third confining element is a ring that surrounds at least a portion of the process region, the third confining element being configured to permit by-product gas from the processing to pass through while substantially confining the plasma inside the process region.

4. The plasma confining assembly as recited in claim 1 wherein the plasma forming components are charged particles or electric fields.

5. The plasma confining assembly as recited in claim 4 wherein the first confining element and the second confining element are arranged to direct charged particles to the exposed conductive surface and sink charged particles therethrough to ground so as to reduce the density of charged particles in regions outside of the process region.

6. The plasma confining assembly as recited in claim 4 wherein the first confining element and the second confining element are arranged to attract electric fields to the grounded conductive surface and the grounded conductive core, respectively, so as to reduce the electrical field strength in regions outside of the process region.

7. The plasma confining assembly as recited in claim 1 wherein the first confining element is disposed in an upper portion of the process chamber, and wherein the second confining element is disposed in a lower portion of the process chamber.

8. The plasma confining assembly as recited in claim 1 wherein the first confining element is disposed in a lower portion of the process chamber, and wherein the second confining element is disposed in an upper portion of the process chamber.

9. The plasma confining assembly as recited in claim 1 wherein the non-exposed conductive core is formed from aluminum and wherein the exposed insulating surface is formed from anodized aluminum.

10. The plasma confining assembly as recited in claim 1 wherein the conductive surface of the first confining element is formed from an electrically conducting material that is either substantially resistant to etching by a plasma present within the chamber during the processing or contributes substantially no metal contamination.

11. The plasma confining assembly as recited in claim 1 wherein the exposed conductive surface faces the exposed insulating surface such that the exposed insulating surface is disposed between the exposed conductive surface and the non exposed conductive core.

12. The plasma confining assembly as recited in claim 1 wherein the insulating surface prevents electrons or negative ions from becoming trapped between the exposed conductive surface and the non exposed conductive core.

13. The plasma confining assembly as recited in claim 1 wherein the exposed conductive surface that is grounded and the exposed insulating surface that covers a non-exposed conductive core that is electrically grounded cooperate to form a DC potential therebetween when an RF voltage is supplied to the process chamber, the DC potential guiding charged particles to the exposed conductive surface that is grounded, the exposed conductive surface that is grounded sinking the guided charged particles therethrough to ground so as to reduce the density of charged particles in regions outside of the process region.

14. A plasma confining assembly for minimizing unwanted plasma formations in regions outside of a process region in a process chamber, comprising:

a first confining element positioned proximate the periphery of the process region, and including a conductive surface that is electrically grounded and exposed to said process region; and a second confining element positioned proximate the periphery of the process region, and including an exposed insulating surface, which is configured to cover a non-exposed conductive core that is electrically grounded, the second confining element being spaced apart from the first confining element such that one of the confining elements is disposed in an upper portion of the process chamber and the other confining element is disposed in a lower portion of the process chamber, wherein the first confining element and the second confining element substantially reduces the effects of plasma forming components that pass therebetween, wherein the first confining element is disposed in an upper portion of the process chamber, and the second confining element is disposed in a lower portion of the process chamber, and wherein the first confining element is a ring that surrounds an upper electrode, and the second confining element is a ring that surrounds a bottom electrode, the upper and bottom electrode being arranged for producing an electric field that helps to ignite and sustain a plasma.

15. A plasma confining assembly for minimizing unwanted plasma formations in regions outside of a process region in a process chamber, comprising:

a first confining element positioned proximate the periphery of the process region, and including a conductive surface that is electrically grounded and exposed to said process region; and a second confining element positioned proximate the periphery of the process region, and including an exposed insulating surface, which is configured to cover a non-exposed conductive core that is electrically grounded, the second confining element being spaced apart from the first confining element such that one of the confining elements is disposed in an upper portion of the process chamber and the other confining element is disposed in a lower portion of the process chamber, wherein the first confining element and the second confining element substantially reduces the effects of plasma forming components that pass therebetween, wherein the first confining element is disposed in a lower portion of the process chamber, and the second confining element is disposed in an upper portion of the process chamber, and wherein the first confining element is a ring that surrounds a bottom electrode, and the second confining element is a ring that surrounds an upper electrode, the upper and bottom electrode being arranged for producing an electric field that helps to ignite and sustain a plasma.

16. A plasma confining assembly for minimizing unwanted plasma formations in regions outside of a process region in a process chamber, comprising:

a first confining element positioned at a boundary between the process region where a plasma is ignited and sustained for processing a work piece and the regions outside of the process region where the plasma is not desired, the first confining element including a conductive member that is exposed within the process chamber to said process region, the conductive member being electrically grounded; and a second confining element positioned at the boundary between the process region where the plasma is ignited and sustained for processing and the regions outside of the process region where the plasma is not desired, the second confining element including an insulating portion that is exposed within the process chamber, and a conductive portion that is covered by the insulating portion so as to keep the conductive portion from being exposed inside the process chamber, the conductive member being electrically grounded, the second confining element being spaced apart from the first confining element so as to form an open area therebetween that permits by-product gases to pass therethrough from the process region to the regions outside of the process region while substantially preventing charged particles or electric fields from passing therethrough from the process region to the regions outside of the process region, wherein the first confining element is formed as a first ring configured to surround a first electrode, and wherein the second confining element is formed as a second ring configured to surround a second electrode that is spaced apart and parallel to the first electrode, the first and second electrodes defining the process region therebetween, the first and second electrodes being configured for generating an electric field that is sufficiently strong to both ignite and sustain the plasma in the process region of the process chamber.

17. The plasma confining assembly as recited in claim 16 further including a pressure control ring formed from a dielectric medium and disposed between the first and second rings, the pressure control ring being configured for physically confining a plasma within the process region, while permitting the passage of process gases to pass therethrough.

18. The plasma confining assembly as recited in claim 16 wherein the exposed insulating surface is configured to be level with a top surface of the second electrode.

19. The plasma confining assembly as recited in claim 16 wherein the first ring is configured to be disposed between the first electrode and a chamber wall of the process chamber, and wherein the second ring is configured to be disposed between the second electrode and the chamber wall of the process chamber.

20. The plasma confining assembly as recited in claim 19 wherein the first ring is spaced apart laterally from the chamber wall thus leaving an open area between the first ring and the chamber wall.

21. The plasma confining assembly as recited in claim 16 wherein the first ring includes an inner ring and an outer ring, wherein the inner ring is formed from a dielectric medium and is configured to be disposed between the first electrode and the outer ring, and wherein the outer ring includes the conductive member of the first ring.

22. The plasma confining assembly as recited in claim 16 wherein the second ring includes an inner ring and an outer ring, wherein the inner ring is formed from a dielectric medium and is configured to be disposed between the second electrode and the outer ring, and wherein the outer ring includes the conductive portion and the insulating portion.

23. The plasma confining assembly as recited in claim 16 wherein the conductive element is a portion of the process chamber.

24. The plasma confining assembly as recited in claim 16 wherein the first ring and the second ring are configured to extend in a radial direction relative to an axis of the process chamber, and wherein an outer edge of the first ring extends further than an outer edge of the second ring.

25. The plasma confining assembly as recited in claim 16 wherein the first and second confining elements are configured to be located between the process region and an exhaust port.

26. The plasma confining assembly as recited in claim 16 wherein the exposed conductive member of the first confining element and the exposed insulating portion of the second confining element each include surfaces that are substantially parallel to one another and that are perpendicular to the boundary between the process region where a plasma is ignited and sustained for processing a work piece and the regions outside of the process region where the plasma is not desired.

27. A plasma confining assembly for minimizing unwanted plasma formations in regions outside of a process region in a process chamber, comprising:

a first confining element including a conductive surface that is electrically grounded and exposed to said process region, the exposed conductive surface that is electrically grounded being configured to sink charged particles therethrough to ground so as to reduce the density of charged particles in regions outside of the process region, the exposed conductive surface that is electrically grounded also being configured to attract electric fields so as to reduce the electrical field strength in regions outside of the process region; and a second confining element including an exposed insulating surface, the exposed insulating surface covering a non-exposed conductive core that is electrically grounded, the insulating surface preventing charged particles from sinking into the non-exposed conductive core that is electrically grounded, the non-exposed conductive core that is electrically grounded being configured to attract electric fields so as to reduce the electrical field strength in regions outside of the process region.

* * * * *